US012581887B2

(12) United States Patent
Tadokoro

(10) Patent No.: US 12,581,887 B2
(45) Date of Patent: Mar. 17, 2026

(54) METHOD OF MANUFACTURING SILICON CARBIDE SEMICONDUCTOR DEVICE AND SILICON CARBIDE SEMICONDUCTOR CHIP

(71) Applicant: Mitsubishi Electric Corporation, Tokyo (JP)

(72) Inventor: Chihiro Tadokoro, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 694 days.

(21) Appl. No.: 17/821,616

(22) Filed: Aug. 23, 2022

(65) Prior Publication Data

US 2023/0137754 A1 May 4, 2023

(30) Foreign Application Priority Data

Oct. 29, 2021 (JP) ................................. 2021-177172

(51) Int. Cl.
| | |
|---|---|
| *H01L 21/78* | (2006.01) |
| *H01L 23/544* | (2006.01) |
| *H10D 62/832* | (2025.01) |

(52) U.S. Cl.
CPC ............ *H01L 21/78* (2013.01); *H01L 23/544* (2013.01); *H01L 2223/5446* (2013.01); *H10D 62/8325* (2025.01)

(58) Field of Classification Search
CPC ................... H01L 21/78; H01L 23/544; H01L 2223/5446; H01L 21/302; H01L 21/3065;
(Continued)

(56) References Cited

U.S. PATENT DOCUMENTS

| | | | |
|---|---|---|---|
| 4,080,621 A | 3/1978 | Funakawa et al. | |
| 2008/0220620 A1* | 9/2008 | Kawada ................ | H01L 21/049 |
| | | | 438/795 |

(Continued)

FOREIGN PATENT DOCUMENTS

| | | |
|---|---|---|
| DE | 102015002542 A1 | 9/2016 |
| JP | S53-5971 A | 1/1978 |

(Continued)

OTHER PUBLICATIONS

An Office Action; mailed by the German Patent and Trademark Office on Sep. 18, 2024, which corresponds to German Application No. 10 2022 124 360.5 and is related to U.S. Appl. No. 17/821,616.

(Continued)

*Primary Examiner* — Thanh T Nguyen
(74) *Attorney, Agent, or Firm* — Studebaker Brackett PLLC

(57) ABSTRACT

Provided is a method of manufacturing a silicon carbide semiconductor device that suppresses the crawling up of a bonding material to the side surfaces of a chip, thereby suppressing a decrease in productivity. In the method of manufacturing the silicon carbide semiconductor device, the method includes, preparing a semiconductor wafer, forming semiconductor elements on the semiconductor wafer, forming a trench, which has a bottom having a roundness, on one main surface of the semiconductor wafer, and performing dicing at a position of the trench having the bottom having the roundness thereby separating the semiconductor elements into individual pieces.

7 Claims, 13 Drawing Sheets

(58) Field of Classification Search
CPC ............. H10D 62/8325; H10D 12/031; H10D 12/032; H10D 12/441; H10D 30/66; H10D 64/518
See application file for complete search history.

(56) References Cited

U.S. PATENT DOCUMENTS

| | | |
|---|---|---|
| 2012/0083059 A1 | 4/2012 | Hoshino et al. |
| 2016/0133784 A1 | 5/2016 | Minamiru et al. |
| 2016/0204220 A1 | 7/2016 | Wada et al. |
| 2016/0254188 A1* | 9/2016 | Priewasser ............ H01L 21/561 |
| | | 438/114 |
| 2020/0335396 A1* | 10/2020 | Yamamoto .............. H01L 21/78 |

FOREIGN PATENT DOCUMENTS

| | | |
|---|---|---|
| JP | H05-275689 A | 10/1993 |
| JP | H10-270686 A | 10/1998 |
| JP | 2008-177538 A | 7/2008 |
| JP | 2009-206221 A | 9/2009 |
| JP | 2012-079800 A | 4/2012 |
| JP | 2015-041678 A | 3/2015 |
| JP | 2019-212772 A | 12/2019 |
| JP | 2020-178064 A | 10/2020 |

OTHER PUBLICATIONS

"Notice of Reasons for Refusal" Office Action issued in JP 2021-177172; mailed by the Japanese Patent Office on Oct. 1, 2024.

* cited by examiner

F I G. 3
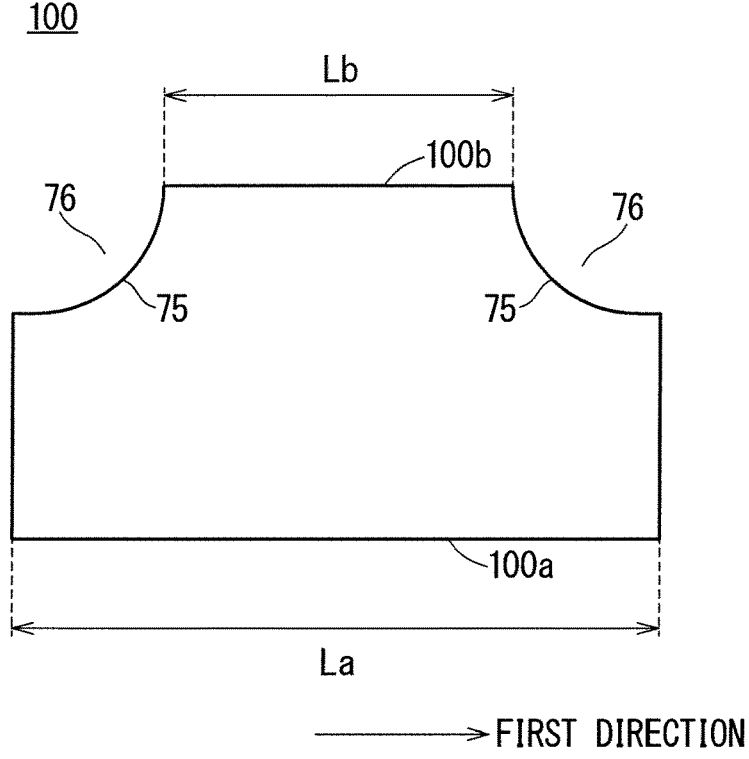
FIRST DIRECTION
F I G. 4
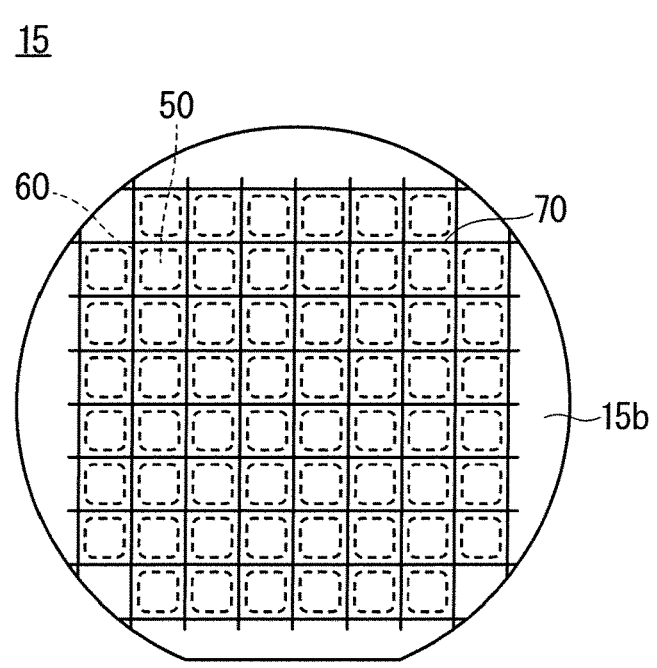

F I G. 5
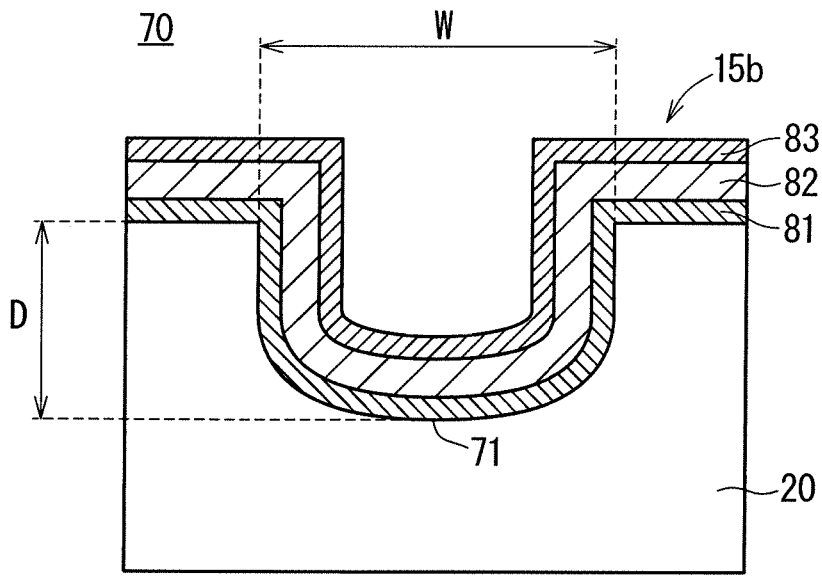
F I G. 6
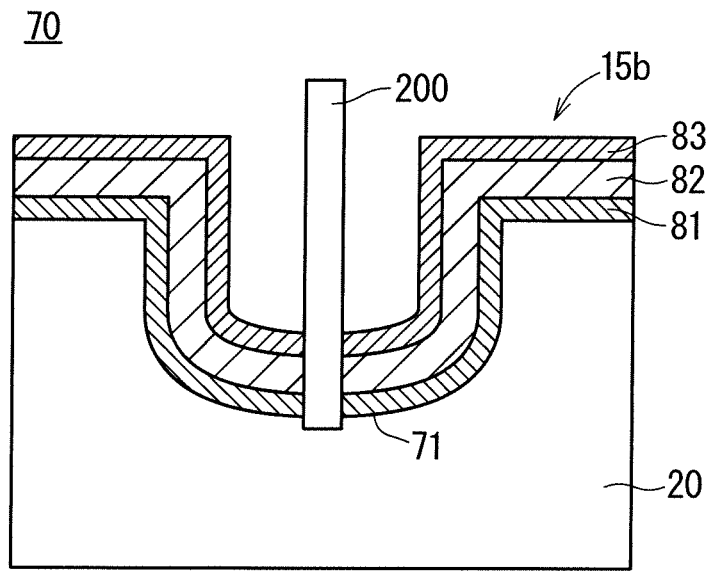

F I G. 7
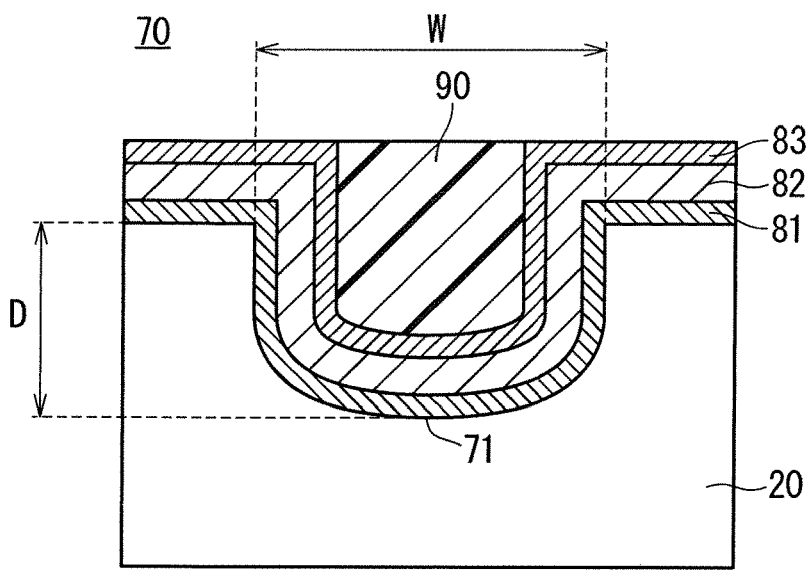
F I G. 8
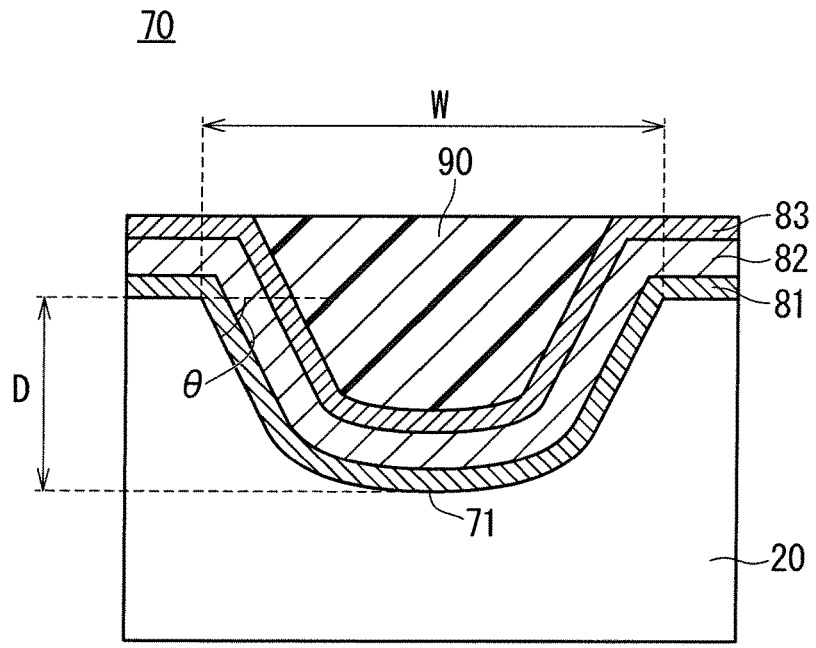

F I G. 11
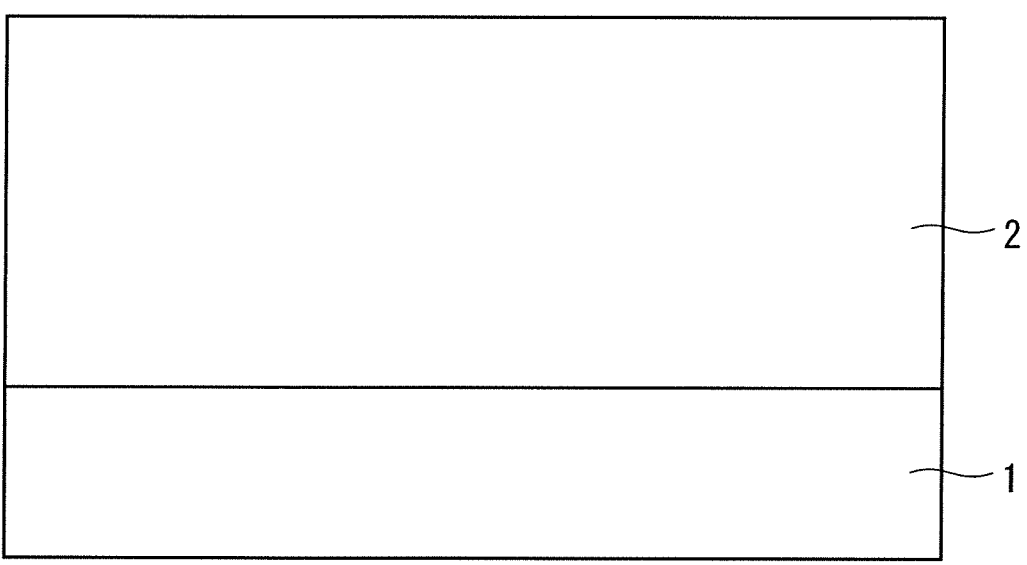
F I G. 12
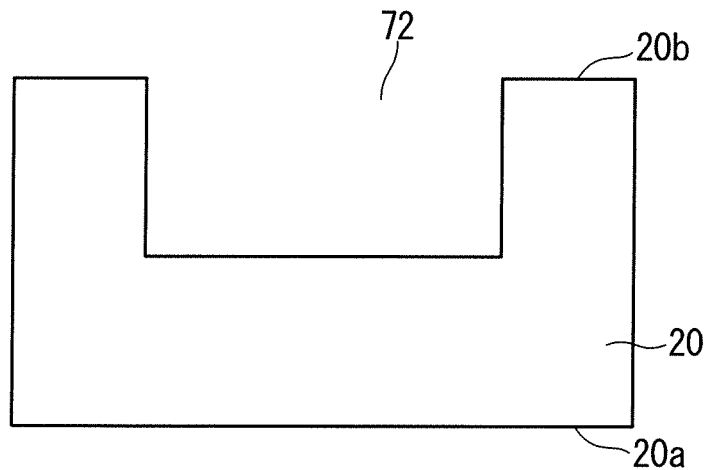

70

50

F I G. 15
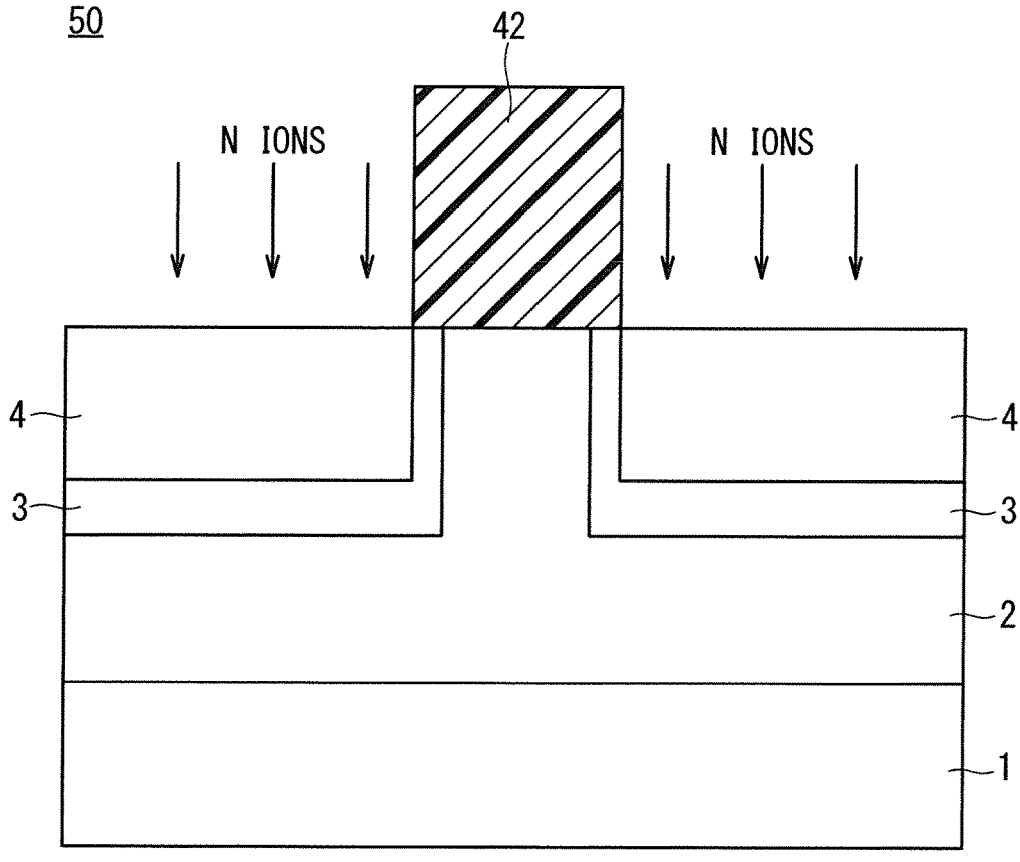
F I G. 16
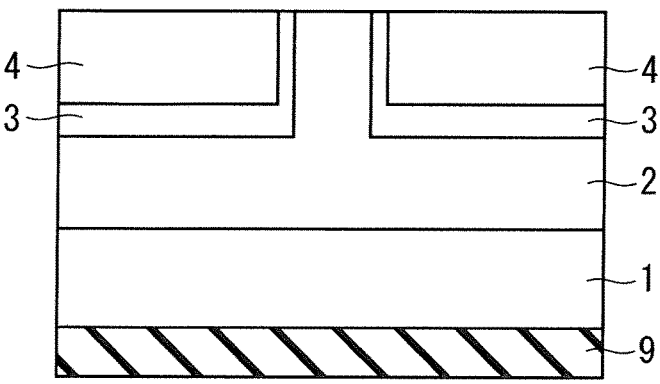

F I G . 1 7
60
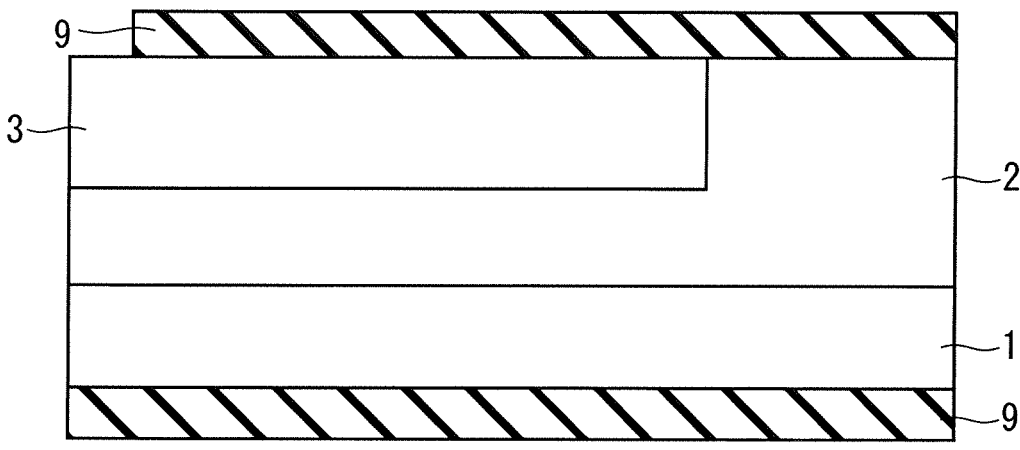
F I G . 1 8
50
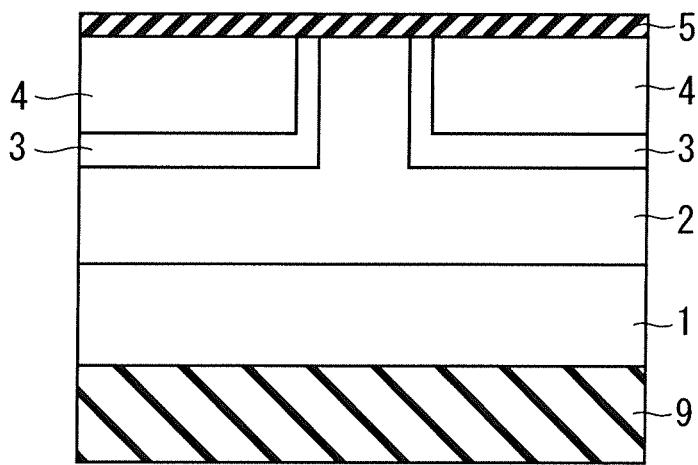

60

50

METHOD OF MANUFACTURING SILICON CARBIDE SEMICONDUCTOR DEVICE AND SILICON CARBIDE SEMICONDUCTOR CHIP

BACKGROUND OF THE INVENTION

Field of the Invention

The present disclosure relates to a method of manufacturing a silicon carbide semiconductor device and a silicon carbide semiconductor chip.

Description of the Background Art

Japanese Patent Application Laid-Open No. 2009-206221 discloses a method in which trenches are formed in a silicon carbide (hereinafter, also referred to as SiC) substrate on which device portions are formed, and the silicon carbide substrate is cleaved along the trench so as to be disassembled into the individual device portions.

SUMMARY

In the prior art, there has been a problem that productivity lowers because the bonding material crawls up on the side surface of a chip.

An object of the present disclosure is to provide a method of manufacturing a silicon carbide semiconductor device that suppresses the crawling up of a bonding material to the side surfaces of a chip, thereby suppressing a decrease in productivity.

In the method of manufacturing the silicon carbide semiconductor device of the present disclosure, the method includes, preparing a semiconductor wafer, forming semiconductor elements on the semiconductor wafer, forming a trench, which has a bottom having a roundness, on one main surface of the semiconductor wafer, and performing dicing at a position of the trench having the bottom having the roundness thereby separating the semiconductor elements into individual pieces.

According to the present disclosure, the method of manufacturing the silicon carbide semiconductor device that suppresses the crawling up of a bonding material to the side surfaces of a chip, thereby suppressing a decrease in productivity is provided.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 3 is a diagram illustrating a contour of a cross section of the semiconductor device of the embodiment;

FIG. 4 is a diagram of a SiC wafer at the time of dicing of the semiconductor device of the embodiment as viewed from the back surface side;

FIG. 5 is a diagram illustrating an example of a state of a dicing line region at the time of dicing in the semiconductor device of the embodiment;

FIG. 6 is a diagram illustrating the dicing method in the method for manufacturing the semiconductor device according to the embodiment;

FIG. 7 is a diagram illustrating an example of a state of the dicing line region at the time of dicing in the semiconductor device of the embodiment;

FIG. 8 is a diagram illustrating an example of a state of the dicing line region at the time of dicing in the semiconductor device of the embodiment;

FIG. 11 is a cross-sectional view illustrating a state in process of the semiconductor device of the embodiment;

FIG. 12 is a cross-sectional view illustrating a state in process of the semiconductor device of the embodiment;

FIG. 15 is a cross-sectional view illustrating a state in process of the semiconductor device of the embodiment;

FIG. 16 is a cross-sectional view illustrating a state in process of the semiconductor device of the embodiment;

FIG. 17 is a cross-sectional view illustrating a state in process of the semiconductor device of the embodiment;

FIG. 18 is a cross-sectional view illustrating a state in process of the semiconductor device of the embodiment;

DESCRIPTION OF THE PREFERRED EMBODIMENTS

A. Embodiment

<A-1. Configuration of Semiconductor Device>

According to a method of manufacturing the silicon carbide semiconductor device of the present embodiment, for example, a Metal Oxide Semiconductor Field Effect Transistor (MOSFET), a pn diode, a Schottky Barrier diode (SBD), a Bipolar Junction Transistor (BJT), a Junction FET (JFET), or an Insulated Gate Bipolar Transistor (IGBT) and the like, are manufactured. A semiconductor device manufactured by the method of manufacturing a silicon carbide semiconductor device according to the present embodiment may include a semiconductor chip, and a semiconductor device including the semiconductor chip as part thereof, such as a semiconductor module in which a semiconductor chip is mounted on the substrate and sealed by a sealing material, for example.

Hereinafter, the description is made about a MOSFET 100, which is a semiconductor chip, illustrated in FIGS. 1, 2, and 3, as an example of the silicon carbide semiconductor device manufactured by the method of manufacturing the silicon carbide semiconductor device of the present embodiment. In the following description, the conductive types of the semiconductor layers p-type and n-type may be replaced.

Figure 1:
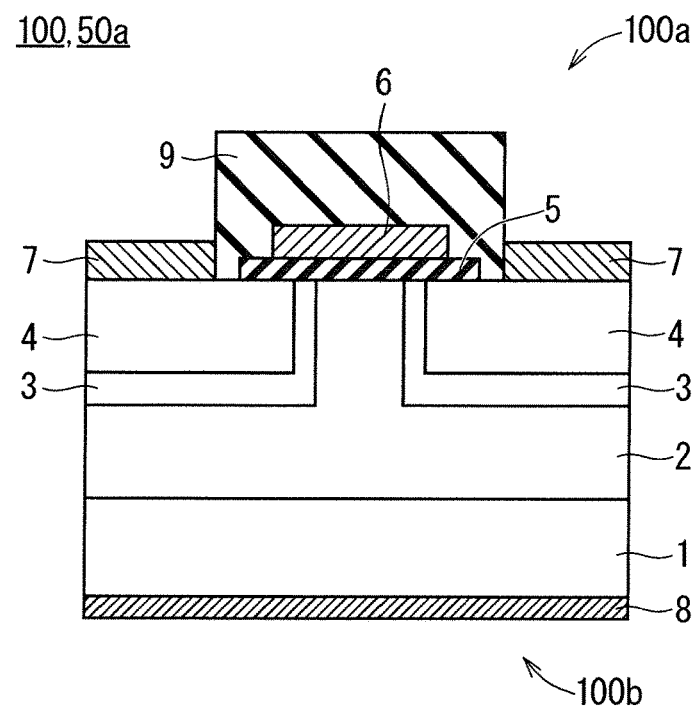
FIG. 1 is a diagram illustrating an active region of a semiconductor device according to an embodiment.

FIG. 1 illustrates an active region 50*a* of the MOSFET 100. FIG. 2 illustrates a pad region 50*b* of the MOSFET 100.

Figure 2:
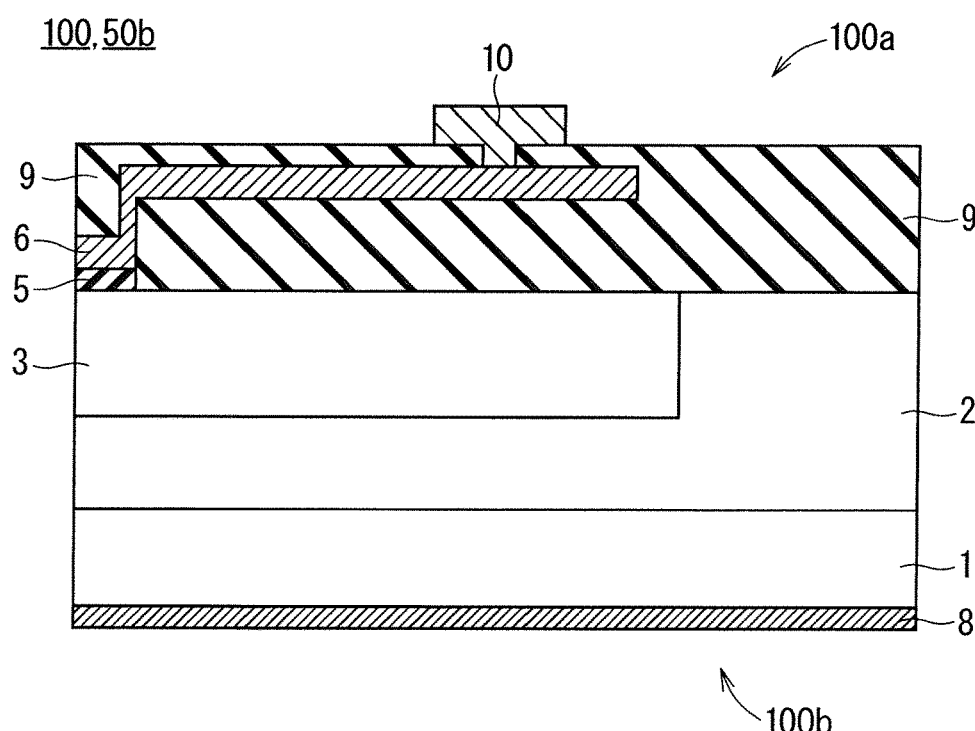
FIG. 2 is a diagram illustrating a pad region of the semiconductor device according to the embodiment.

As illustrated in FIGS. 1 and 2, the MOSFET 100 includes a SiC substrate 1, a SiC drift layer 2, a base region 3, a source region 4, a gate oxide film 5, a gate wiring 6, a source electrode 7, a drain electrode 8, interlayer insulating film 9 and a gate pad 10.

The active region 50*a* is a region through which the main current flows when the semiconductor device is in an ON state. The pad region 50*b* is a region in which a control pad for controlling the MOSFET 100 is provided. The control pad to be provided in the pad region 50*b* is, for example, a current sense pad (not illustrated) and a gate pad 10. The current sense pad is a control pad for detecting the main current of the MOSFET 100. The gate pad 10 is connected to the gate wiring 6 of the MOSFET 100, and the main current of the MOSFET 100 is controlled by applying a voltage to the gate pad 10 from the outside.

The SiC drift layer 2 is formed on the front surface of the SiC substrate 1.

The MOSFET 100 has a front surface 100*a* as one main surface (an example of a first main surface) and a back surface 100*b* as an other main surface (an example of a second main surface).

The base region 3 is selectively formed on the surface layer portion of the front surface of the SiC drift layer 2. The base region 3 is a p-type semiconductor layer and contains, for example, aluminum (Al) as p-type impurities.

The source region 4 is selectively formed in the surface layer portion on the front surface of the base region 3 inside the cell. The source region 4 is an n-type semiconductor layer. The source region 4 contains, for example, nitrogen (N) as n-type impurities.

The gate oxide film 5 is formed on the source regions 4, the base region 3, and the region of the SiC drift layer 2 interposed between two adjacent source regions 4. The gate wiring 6 is formed on the gate oxide film 5. The source electrode 7 is formed on the front surface of the source region 4. The drain electrode 8 is formed on the back surface of the SiC substrate 1. The gate wiring 6 and the source electrode 7 are separated by the interlayer insulating film 9. The gate wiring 6 is drawn from the active region 50*a* to the pad region 50*b*, and is connected to the gate pad 10 at the pad region 50*b*.

Although the MOSFET 100 is illustrated as a planar gate structure in FIG. 1, the MOSFET 100 may be of a trench gate type.

FIG. 3 is a diagram illustrating a contour of a cross section of the MOSFET 100 being a semiconductor chip. In FIG. 3, the details of the internal structure of the MOSFET 100 are omitted.

The MOSFET 100 has rounded portions 75 which are rounded portions on side surfaces of the MOSFET 100 which is side surfaces intersecting a first direction. The roundness of the rounded portion 75 has a shape in which, an angle formed between the side surface intersecting the first direction of the MOSFET 100 as a SiC chip and the back surface 100 grows smaller in the rounded portion 75 when the side surface is traced from the back surface 100*b* side toward the front surface 100*a*. Such rounded portions 75 allow the MOSFET 100 to have spaces 76 at the chip end on the back surface 100*b* side. The rounded portions 75 are located, for example, on the back surface 100*b* side from the middle between front surface 100*a* and the back surface 100*b* of the side surface of the MOSFET 100. In the MOSFET 100, due to the presence of the rounded portions 75, a length Lb, representing a length from the tip end to the tip end on the back surface 100*b* side in the first direction being an in-plane direction, is shorter than a length La, representing a length from the tip end to the tip end on the front surface 100*a* side in the first direction.

The MOSFET 100 may have rounded portions 75 on the side surfaces of the MOSFET 100 as a SiC chip being the side surfaces along the first direction. In this case, a length from the tip end to the tip end in a second direction intersecting with the first direction on the back surface 100*b* side is shorter than a length from the tip end to the tip end in the second direction on the front surface 100*a* side.

When mounting the MOSFET 100 on an external substrate of the MOSFET 100, the external substrate and the back surface of the MOSFET 100 are bonded with a bonding material. At that point, the bonding material also flows into the spaces 76 created by the MOSFET 100 having the rounded portions 75; therefore, the accumulation of the excess bonding material in the spaces 76 reduces the amount of the bonding material that crawls up the side surfaces of the MOSFET 100. Therefore, in the MOSFET 100, the crawling up of the bonding material at the side surfaces of the chip is suppressed more than that of the chip having no rounded portions 75, suppressing the decrease in productivity thereof. Further, the flowing of the bonding material into the spaces 76 thickens the thickness of the bonding material at the ends of the chip, and this improves the heat dissipation efficiency during the use the MOSFET 100.

<Method of Manufacturing Semiconductor Device>

Figure 9:
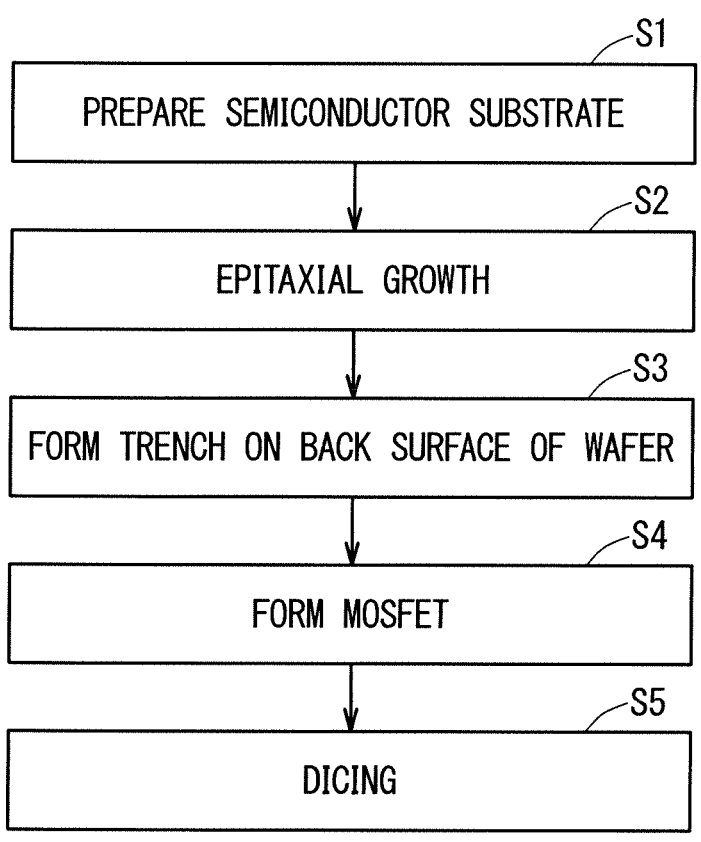
FIG. 9 is a flowchart of the manufacturing method of the semiconductor device of the embodiment.

FIG. 9 is a flowchart of a method of manufacturing the semiconductor device according to the present embodiment. The method of manufacturing the semiconductor device of the present embodiment includes a process of Step S1 to Step S5.

<A-2-1. Dicing>

First, the dicing in Step S5 will be described.

FIG. 4 is a diagram of a SiC wafer 15 before dicing from the back surface 15*b* side. As illustrated in FEC. 4, the SiC wafer 15 using silicon carbide as the material thereof includes element regions 50, terminal regions 60, and dicing line regions 70. In FIG. 4, the termination regions 60 are indicated by broken lines and the dicing line regions 70 are indicated by solid lines. A terminal region 60 is formed so as to surround an element region 50.

An element structure of the MOSFET 100 is formed in a region including the element region 50 and the terminal region 60. As illustrated in FIG. 4, of a plurality of the structure of MOSFETs 100 are formed in a matrix on the SiC wafer 15.

In the element region 50, the structures of the active region 50*a* and the pad region 50*b* of the MOSFET are formed. That is, the element region 50 is a region that operates as a MOSFET.

The terminal region 60 is provided so as to surround the element region 50. The termination region 60 is a region for maintaining the breakdown voltage of the MOSFET 100.

The dicing line region 70 is provided so as to surround the terminal region 60 in plan view. The dicing line region 70 is a region corresponding to ends of the chip after the separation of the MOSFETs 100 into an individual chip by dicing.

FIG. 5 is a diagram illustrating an example of a state of the dicing line region 70 of the SiC wafer 15. In FIG. 5, a dicing line extends in the direction perpendicular to the sheet of the drawing. In FIG. 5 and FIGS. 6 to 8 described later, the structure on the front surface side of the SiC wafer 15 is omitted.

As illustrated in FIG. 5, a trench 71 is provided on a back surface 15*b* side of the dicing line region 70 of the SiC wafer 15.

A width W of the trench 71 is, for example, 10 μm or more, and a depth D of the trench 71 is, for example, 5 μm or more. The width W of the trench 71 is the width of an opening of the trench 71 on the back surface of a SiC semiconductor layer 20. The depth of the trench 71 is the depth from the back surface of the SiC semiconductor layer 20. The SiC semiconductor layer 20, which is a SiC semi- conductor portion of the MOSFET 100, includes the SiC substrate 1, the SiC drift layer 2, the base region 3, and the source region 4.

The trenches 71 are provided in a grid pattern correspond- ing to the dicing line regions 70 provided in a grid pattern as illustrated in FIG. 4. The trench 71 is provided so as to surround the terminal region 60 in plan view.

The bottom of trench 71 is rounded. Due to the roundness, the side surfaces and the bottom surface of the trench 71 are smoothly connected without bending at a right angle at the bottom of the trench 71. The radius of curvature R at the bottom of the trench is preferably 10 μm or more. The radius of curvature R represents the radius of curvature of the intersection of the cross section orthogonal to the extending direction of the trench and the inner surface of the trench.

As illustrated in FIG. 5, inside the trench 71, a silicide Ti layer 81, an Ni layer 82, and an Au layer 83 are sequentially laminated on the surface of the SiC semiconductor layer 20.

A buffer material 90 may be provided in the trench 71 as illustrated in FIG. 7. Regarding the buffer material 90, for example, as illustrated in FIG. 7, the buffer material 90 is provided so that the remaining space inside the trench 71, in which the silicide Ti layer 81, the Ni layer 82, and the Au layer 83 are formed, is filled therewith. For example, although the surface of the trench 71 is covered with the buffer material 90 via the silicide Ti layer 81, the Ni layer 82, and the Au layer 83, the buffer material 90 may also be filled such that only a part of the remaining space after the silicide Ti layer 81, the Ni layer 82, and the Au layer 83 is formed inside the trench 71 is filled with the buffer material 90. The buffer material 90 is, for example, a resin or an oxide film. The imbedding of a resin in the trench is easier than that of the oxide film, and a resin has a higher degree of hardness than that of the oxide film. For this reason, a resin is more preferable for the buffer material 90.

By performing dicing from the back surface 15*b* side with the buffer material 90 provided in the trench 71, the impact when the dicing blade 200 (see FIG. 6) hits the SiC semiconductor layer 20 in the dicing is alleviated. As a result, chipping on the back surface is suppressed.

In a case where the buffer material 90, which is an insulator, for example, a resin or an oxide film, is provided inside the trenches 71, and then the SiC wafer 15 is diced to separate into the individual MOSFETs 100, parts where trenches 71 were formed before dicing, of the surfaces the MOSFETs 100, are covered with the buffer material 90 after the dicing.

The bottom of the trench 71 need only be rounded, and the side surfaces of the trench 71 may each have an inclination, for example, as illustrated in FIG. 8. The angle θ between the side surface of the trench 71 and the back surface of the SiC semiconductor layer 20 is, for example, 45 to 60 degrees. The case where the angle θ is 90 degrees corresponds to the case where the side surface of the trench 71 does not have an inclination. The inclination of the side surface of the trench 71 is such that the opening side of the trench 71 becomes wider than the bottom surface side due to the inclination. The side surface of the trench 71 has an incli- nation; therefore, the impact when the dicing blade 200 hits the SiC semiconductor layer 20 in dicing from the back surface side is alleviated, so that chipping on the back surface 15*b* side of the SiC wafer 15 can be further sup- pressed.

The side surfaces of the trench 71 may have a stair shape. In this case as well, the impact when the dicing blade 200 hits the SiC semiconductor layer 20 in dicing from the back surface can be mitigated with the roundness provided at the bottom surface of the stair shape on the side surfaces of the trench 71, so that the chipping on the back surface can be suppressed.

When the side surfaces of the trench 71 each have an inclination, or when the side surfaces of the trench 71 have a stair shape, the width W of the trench 71 is, for example, 10 μm or more, and the depth D of the trench 71 is, for example, 5 μm or more.

When the side surfaces of the trench 71 have a stair shape, even if the width of the dicing blade 200 changes, chipping can be suppressed by performing appropriate dicing accord- ing to the width of the dicing blade 200. A SiC semicon- ductor is harder than an Si semiconductor; therefore, the dicing blade 200 may wear and the width of the dicing blade 200 may change as the SiC semiconductor is continuously diced. In this case, work such as grinding the worn dicing blade 200 to the original state or replacing the blade is required, deteriorating the productivity. Having a stair shape on the side surfaces of the trench suppresses the frequency of work such as grinding the dicing blade 200 to its original state or replacing the blade, and improves the productivity.

When the side surfaces of the trench 71 have a stair shape, in the trench 71, at each step and at each corner of the stair shape of the side surfaces of the trench 71 may be rounded.

By dicing the SiC wafer 15 at the positions of the trenches 71 as illustrated in FIG. 6, the individual MOSFETs 100 illustrated in FIG. 3 are obtained. The dicing is performed using a dying blade 200 having a width narrower than the width. W of the trench 71. It should be noted that the trench 71 desirably has the width W 10 to 20 μm wider than the width of the dicing blade. With this, sufficiently large spaces 76 are obtained.

In the MOSFET 100, due to the roundness of the bottom of the trench 71, the rounded portions 75 are formed in accordance with the roundness of the bottom of the trench 71.

Typically, when the MOSFET 100 is mounted on the external substrate of the MOSFET 100, the external sub- strate of the MOSFET 100 and the back surface 100*b* (that is, the drain electrode 8 side) are bonded via a bonding material such as solder.

SiC semiconductors are harder than Si semiconductors. Therefore, when the SiC wafer 15 is diced to separate the chips from each other from the back surface 15*b* side, chipping (chips in shell shape) or cracks are more likely to occur on the back surface 15*b*, as compared with the case of an Si wafer. Chipping on the back surface 15*b* is particularly likely to occur at the corners of chips. When chipping occurs on the back surface 15*b*, the metal layer, that is, the silicide Ti layer 81, the Ni layer 82, and the Au layer 83, disappears at those parts, so that the connectivity between the bonding material and the MOSFET 100 decreases and voids are likely to occur, adversely affecting the characteristics of MOSFET 100. In the method of manufacturing the semi- conductor device according to the present embodiment, the trench 71 has a rounded bottom at the time of dicing, the force applied to the metal layer on the back surface 15*b* at the time of dicing is dispersed. Therefore, peeling of the metal layer on the back surface 15*b* during dying is suppressed.

When progressive cracks are generated by dicing, if the cracks progress inside the semiconductor chip, the characteristics and reliability thereof may be seriously affected. In the method of manufacturing the semiconductor device according to the present embodiment, the trench 71 has a rounded bottom at the time of dicing, the impact when the dicing blade 200 hits the SiC semiconductor layer 20 is alleviated, and the generation of progressive cracks is suppressed.

<A-2-2. Method of Manufacturing of Semiconductor Device>

A method of manufacturing the semiconductor device of the present embodiment will be described with reference to the flowchart of FIG. 9.

First, in Step S1, the n-type SiC substrate 1 is prepared. What is obtained after processing the SiC substrate 1 in each Step is also referred to as the SiC wafer 15 in each Step until dicing in Step S5. In Step S1, the SiC substrate 1 is the SiC wafer 15.

Next, in Step S2, the SIC drift layer 2 is epitaxially grown on the front surface of the SiC substrate 1 by the CVD method (see FIG. 11). The concentration of the n-type impurities in the SiC drift layer 2 is $1 \times 10^{15}$ cm$^{-3}$ to $1 \times 10^{17}$ cm$^{-3}$, and the thickness thereof is 5 to 50 μm.

Next, in Step S3, the trenches 71 are formed in the SiC wafer 15. In Step S3, first, an insulating film having a thickness of 2 μm or more is formed on the back surface 15*b* of the SiC wafer 15. The insulating film is, for example, an oxide film. Next, the insulating film is patterned so that the insulating film has openings in portions of the dicing lines. Next, the trenches 72 are formed by dry-etching the SiC wafer 15 using the insulating film as a mask (see FIG. 12).

Figure 13:
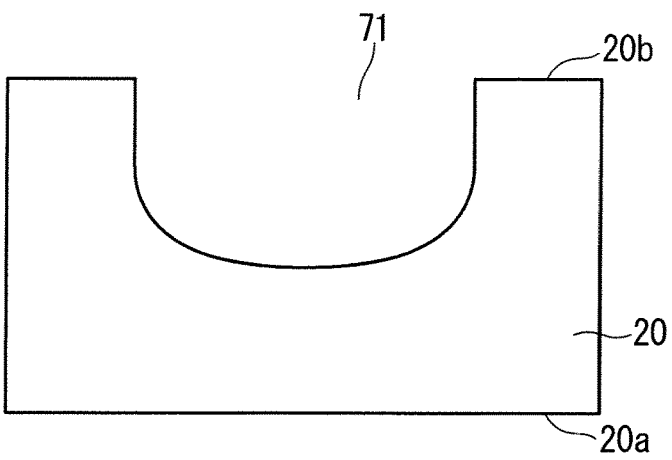
FIG. 13 is a cross-sectional view illustrating a state in process of the semiconductor device of the embodiment.

In Step S3, after forming the trenches 72, heat treatment is performed at a temperature of 1700° C. or higher to form a roundness at the bottoms of the trenches 72, and the trenches 72 is transformed to the trenches 71 (see FIG. 13). In the heat treatment, the high temperature destabilizes the bonding between the atoms and causes the movement of the atoms, thereby forming roundness. The bond energy among atoms in a SiC semiconductor is higher than that in an Si semiconductor; therefore, the temperature required to destabilize the bond among atoms is higher in a SiC semiconductor than in an Si semiconductor. In a SiC semiconductor, the temperature is set to 1700° C. or higher to destabilize the bond among atoms and form the roundness.

Figure 10:
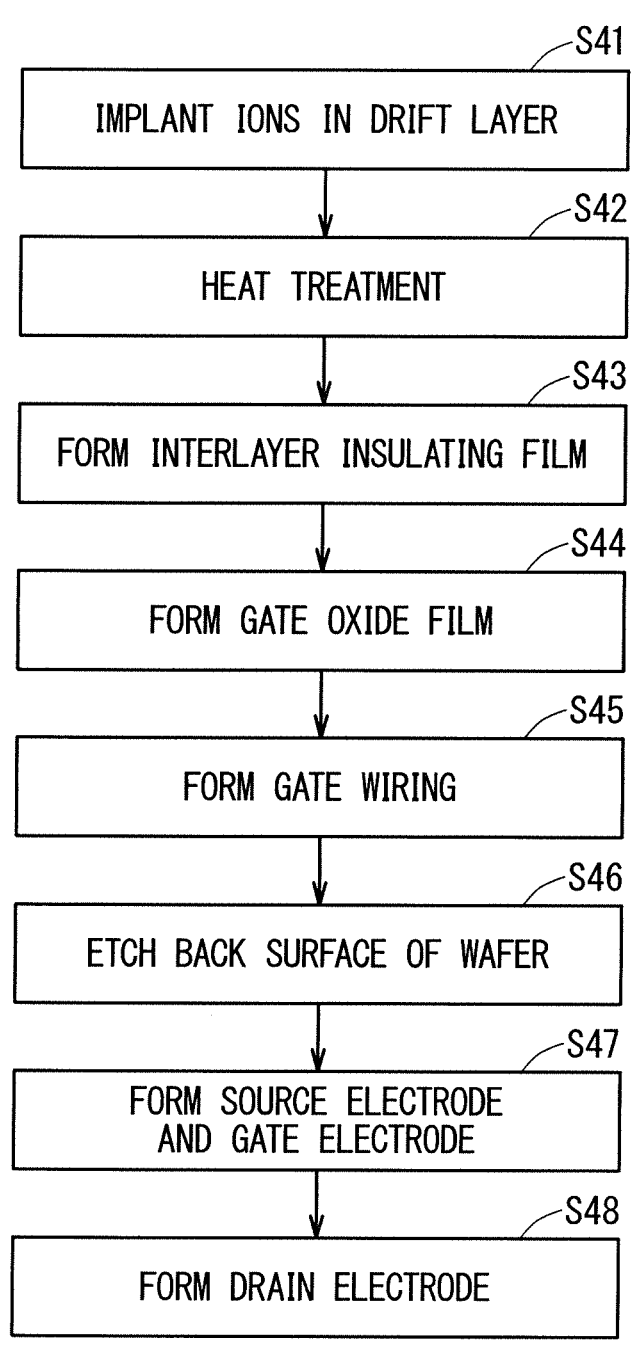
FIG. 10 is a flowchart of a process of the method of manufacturing the semiconductor device of the embodiment.

Next, in Step S4, an element structure of the MOSFET 100 is formed. FIG. 10 is a flowchart illustrating Step S4 in detail. Step S4 has Sub-Steps, as illustrated in FIG. 10, which are from Step S41 to Step S48.

Figure 14:
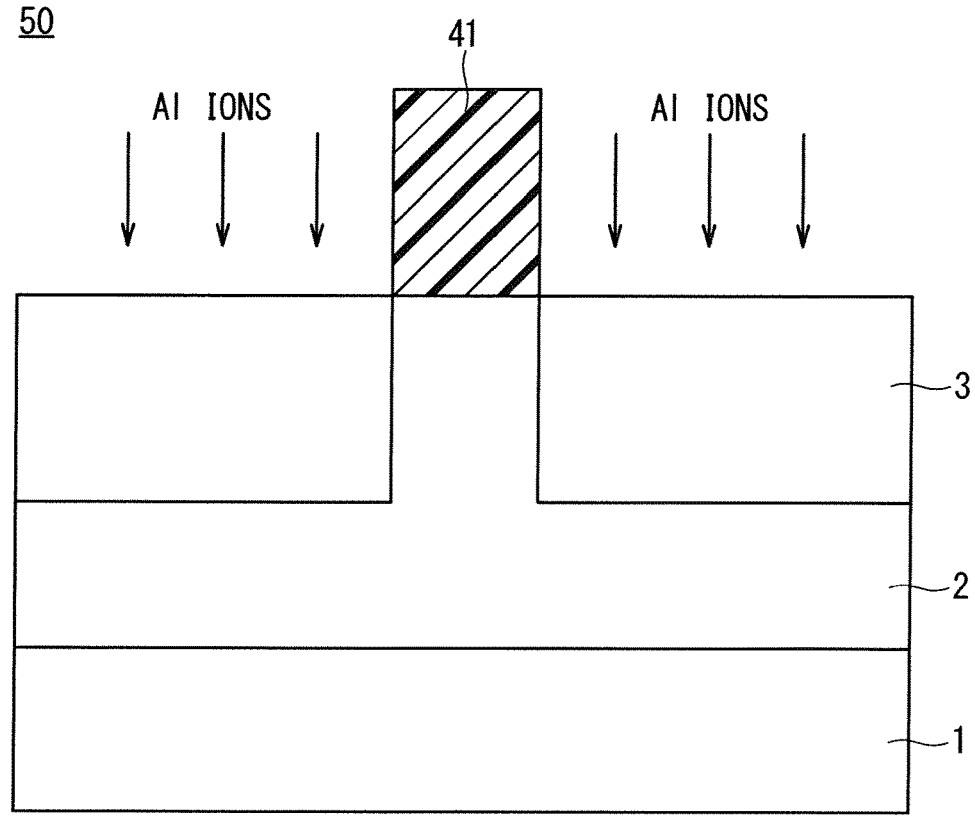
FIG. 14 is a cross-sectional view illustrating a state in process of the semiconductor device of the embodiment.

In Step S41, a mask 41 is formed on the front surface of the SiC drift layer 2, and Al, which are p-type impurities, are ion-implanted into the SiC drift layer 2 using the mask 41 (see FIG. 14). At this point, the depth of ion implantation of Al is about 0.5 to 3 μm, which does not exceed the thickness of the SiC drift layer 2. The impurity concentration of the ion-implanted Al is in the range of $1 \times 10^{17}$ cm$^{-3}$ to $1 \times 10^{19}$ cm$^{-3}$, which is higher than the n-type impurity concentration of the SiC drift layer 2. Of the SiC drift layer 2, the region where Al is ion-implanted and becomes p-type becomes the base region 3. After performing the ion implantation of Al, the mask 41 is removed.

Further, in Step S41, after removing the mask 41, a mask 42 is formed on the front surface of the SiC drift layer 2, and the mask 42 is used to ion-implant N, which is n-type impurities, into the front surface layer portion of the SiC drift layer 2 (see FIG. 15). In Step S41, the region of the SiC drift layer 2 in which the Al ion has been previously injected in Step S41 and is also collectively referred to as the SiC drift layer 2. The depth of ion implantation of N is made shallower than the thickness of base region 3. The impurity concentration of N to be ion-implanted exceeds the p-type impurity concentration in the base region 3 in the range of $1 \times 10^{18}$ cm$^{-3}$ to $1 \times 10^{21}$ cm$^{-3}$. In the region in the SiC drift layer 2 into which N is implanted, the region illustrating the n-type is the source region 4. After performing N-ion implantation, the mask 42 is removed.

Next, in Step S42, the N and Al ion implanted in Step S41 are activated by performing annealing at 1300 to 1900° C. for 30 seconds to 1 hour in an atmosphere of an inert gas such as argon (Ar) gas by a heat treatment apparatus.

Next, in Step S43, first, the interlayer insulating film 9 is formed by the CVD method (see FIGS. 16 and 17). When the gate wiring 6 formed in the subsequent process is drawn to the pad region 50*b* and connected to the gate pad 10, the SIC drift layer 2, the base region 3, the source region 4 are insulated from the gate wiring 6 by the interlayer insulating film 9. The thickness of the interlayer insulating film 9 is preferably 1 to 3 μm, which does not affect the gate capacitance and makes the interlayer insulating film 9 less likely to be broken due to switching, surge, or the like. The material of the interlayer insulating film 9 which is an inorganic film is Boro-Phospho Silicate Glass (BPSG), Phospho Silicate Glass (PSG), Tetraethyl orthosilicate (TEOS) or the like. The interlayer insulating film 9 is formed on the Si surface 13 (that is, the main surface on the source region 4 side) being the front surface of the SiC wafer 15 and on the C surface (that is, the main surface on the lower surface side of the SiC substrate 1) being the lower surface of the SiC wafer 15.

Further, in Step S43, after the interlayer insulating film 9 is formed, etching is performed, the interlayer insulating film 9 on the front surface side is removed in the active region 50*a* by patterning, dry etching, and wet etching, and also in the pad region 50*b*, the interlayer insulating film 9 at a desired position on the front surface side is removed (see FIGS. 16 and 17).

Figure 19:
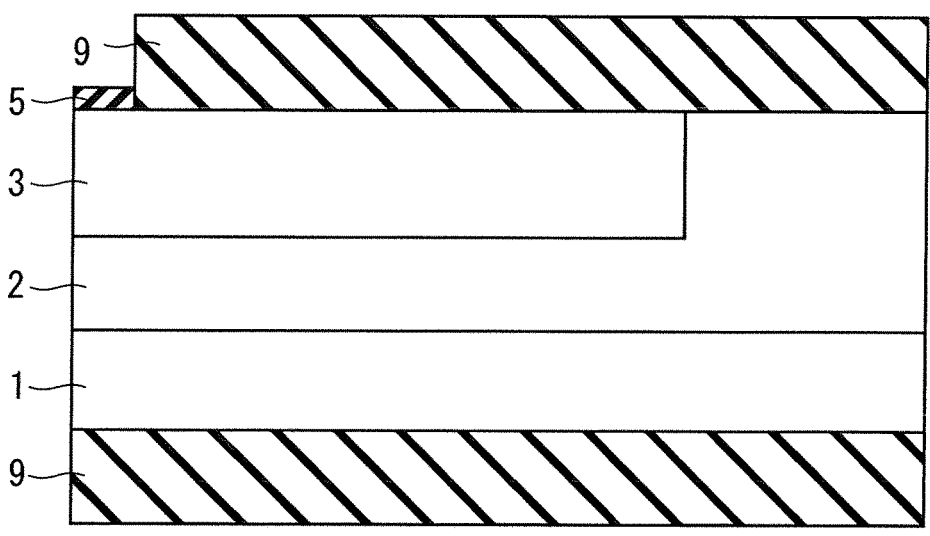
FIG. 19 is a cross-sectional view illustrating a state in process of the semiconductor device of the embodiment.

Next, in Step S44, first, the interlayer insulating film 5 is formed (see FIGS. 18 and 19). Next, in Step S44, the gate oxide film 5, which is a thermal oxide film, is formed in a region where no interlayer insulating film 9 is formed on the front surface side of the SiC wafer 15. Further in Step S44, post-annealing is performed to reduce the interface state at the interface between SiO$_2$ and SiC. Post-annealing is carried out under a WET atmosphere, a nitrogen oxide (NO or N$_2$O) atmosphere, an oxidation gas atmosphere such as a POCl$_3$ atmosphere, or a reducing gas atmosphere such as H$_2$ gas or NH$_3$ gas.

Then, in Step S45, the gate wiring 6 is formed on the gate oxide film 5. The gate wiring 6 is formed by forming a polycrystalline silicon film having conductivity by the reduced pressure CVD method and then patterning the polycrystalline silicon film. After that, an interlayer insulating film 9 having a thickness of about 1.0 to 3.0 μm is additionally formed by a CVD apparatus to cover the gate wiring 6.

Figure 20:
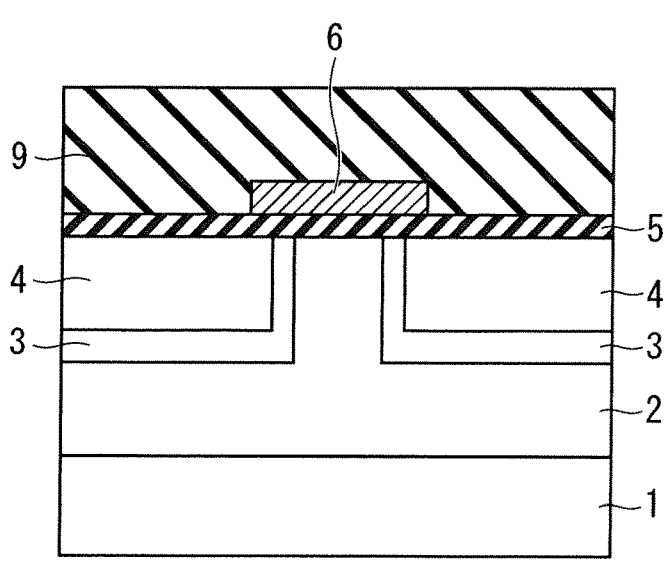
FIG. 20 is a cross-sectional view illustrating a state in process of the semiconductor device of the embodiment.
Figure 21:
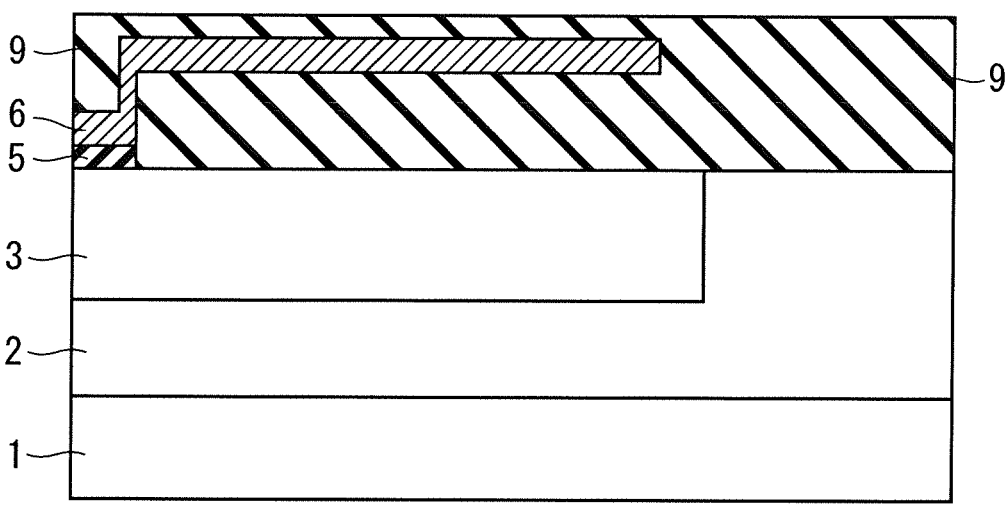
FIG. 21 is a cross-sectional view illustrating a state in process of the semiconductor device of the embodiment.

Then, in Step S46, the interlayer insulating film 9 and the polycrystalline silicon film on the back surface of the SiC wafer 15 are removed by wet etching or dry etching. With this, the states illustrated in FIGS. 20 and 21 are obtained.

Next, in Step S47, the source electrode 7 and the gate pad 10 are formed.

Figure 22:
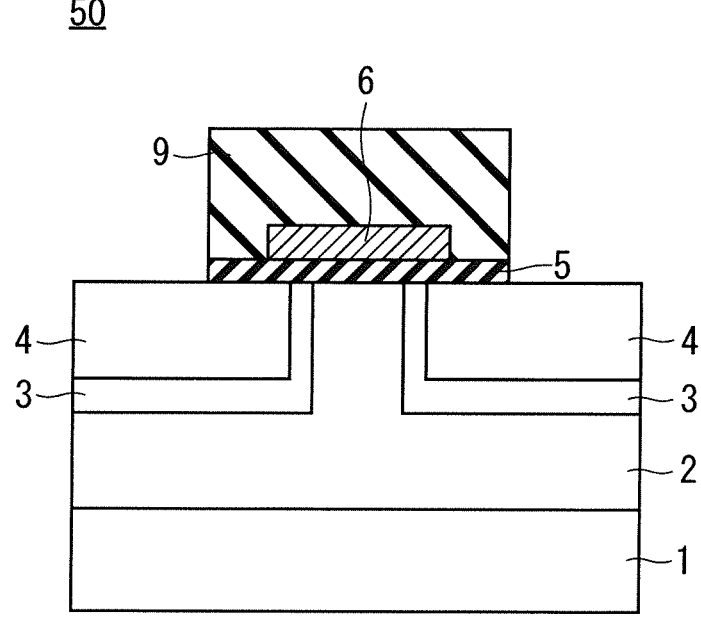
FIG. 22 is a cross-sectional view illustrating a state in process of the semiconductor device of the embodiment.
Figure 23:
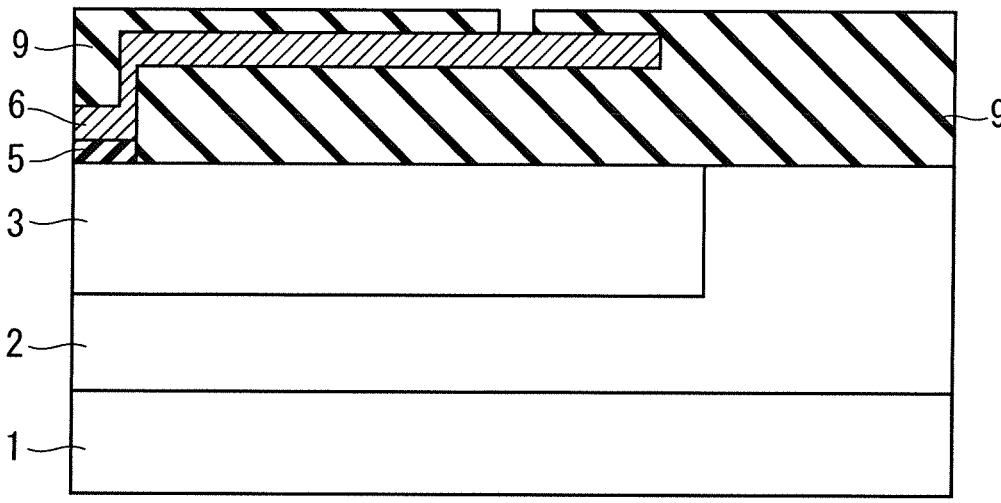
FIG. 23 is a cross-sectional view illustrating a state in process of the semiconductor device of the embodiment.

In Step S47, first, the interlayer insulating film 9 in the region where the source electrode 7 is to be formed is removed by patterning and dry etching. Further, after forming a silicide layer in the region where the source electrode 7 is to be formed, the interlayer insulating film 9 in the region in contact with the gate wiring 6 is removed by patterning and dry etching (see FIGS. 22 and 23). Next, the source electrode 7 electrically connected to the source region 4 and the gate pad 10 electrically connected to the gate wiring 6 are formed (see FIGS. 1 and 2). The source electrode 7 and the gate pad 10 are formed by forming a film such as an Al alloy on the entire front surface of the SiC wafer 15 by a sputtering method, and then forming the film by patterning and wet etching.

Next, in Step S48, the drain electrode 8 is formed on the back surface side of the SiC wafer 15. With this, the states illustrated in FIGS. 1 and 2 are obtained. The material of the drain electrode 8 includes, for example, an Al alloy. When forming the drain electrode 8, for example, Ti is deposited in the region including the trenches 71 in the dicing line regions 70. Then, by annealing treatment, the deposited Ti and the like are made silicided. Then, Ni and Au are deposited on the Al alloy of the trench 71 and the drain electrode 8 by a sputtering method or plating as materials necessary for solder-bonding the MOSFET 100 and the external element of the MOSFET 100 to each other.

After Step S48, a resin or an oxide film may be provided inside the trench 71 as a buffer material 90. When a resin is used as the buffer material 90, the resin is applied to the entire back surface 15b of the SiC wafer 15 and then the resin other than the trench 71 is ground and removed, thereby providing the buffer material 90 inside the trench 71. When an oxide film is used as the buffer material 90, a mask having an opening in the opening portion of the trench 71 is formed by patterning, and the oxide film is formed inside the trench 71 using the mask.

After Step S4, the wafer 15 is diced in Step S5, as described in <A-2-1. Dicing>.

Through the above Steps, the MOSFETs 100 as individual silicon carbide semiconductor chips can be obtained.

As described above, in the method of manufacturing the semiconductor device of the present embodiment, the trenches 71 each having a rounded bottom are formed on one main surface of the SiC wafer 15, and dicing is performed at the positions of the trenches 71 each having the rounded bottom thereby separating the MOSFETs, which are the semiconductor elements, into individual pieces. As a result, the MOSFET 100 as a semiconductor chip is obtained.

By dicing at the positions of the trenches 71 each having the rounded bottom, the spaces 76 are formed at the ends of the MOSFET 100. Therefore, when the MOSFET 100 is bonded to an external substrate or the like of the MOSFET 100, the crawling up of the bonding material to the side surfaces of the chip is suppressed, suppressing the decrease in productivity thereof. The trench 71 having a rounded bottom suppresses the occurrence of chipping or cracking during the dicing.

In the present disclosure, the embodiments can be combined, appropriately modified or omitted, without departing from the scope of the disclosure.

While the disclosure has been shown and described in detail, the foregoing description is in all aspects illustrative and not restrictive. It is therefore understood that numerous modifications and variations can be devised without departing from the scope of the disclosure.

What is claimed is:

1. A method of manufacturing a silicon carbide semiconductor device comprising:
preparing a semiconductor wafer;
forming a trench, which has a bottom having a roundness, on one main surface of the semiconductor wafer;
forming semiconductor elements on the semiconductor wafer after forming the trench; and
performing dicing at a position of the trench having the bottom having the roundness after forming the semiconductor elements, thereby separating the semiconductor elements into individual pieces.

2. The method of manufacturing the silicon carbide semiconductor device according to claim 1, wherein
the trench having the bottom having the roundness has a width of 10 μm or more.

3. The method of manufacturing the silicon carbide semiconductor device according to claim 1, wherein
after forming a trench to be the trench having the bottom having the roundness, the roundness is formed by performing heat treatment.

4. The method of manufacturing the silicon carbide semiconductor device according to claim 1, wherein
the trench having the bottom having the roundness has inclinations on side surfaces thereof, and
in the trench having the bottom having the roundness, an opening side thereof is wider than a bottom surface side thereof due to the inclinations.

5. The method of manufacturing the silicon carbide semiconductor device according to claim 1, wherein
a resin is provided inside the trench having the bottom having the roundness, and the dicing is performed in a state where the resin is provided inside the trench having the bottom having the roundness.

6. The method of manufacturing the silicon carbide semiconductor device according to claim 1, wherein
the dicing is performed from the one main surface of the semiconductor wafer.

7. The method of manufacturing the silicon carbide semiconductor device according to claim 1, wherein the semiconductor elements are transistors or diodes.

* * * * *